United States Patent [19]
Lin

[11] Patent Number: 5,658,697
[45] Date of Patent: Aug. 19, 1997

[54] METHOD FOR PRODUCING COLOR FILTERS BY THE USE OF ANIONIC ELECTROCOATS

[75] Inventor: Hsien-Kuang Lin, Taipei, Taiwan

[73] Assignee: Industrial Technology Research, Institute, Hsin chu, Taiwan

[21] Appl. No.: 633,595

[22] Filed: Apr. 17, 1996

[51] Int. Cl.$^6$ .................................................. G02B 5/20
[52] U.S. Cl. ................................................. 430/7; 205/122
[58] Field of Search .............................. 430/7, 321, 328, 430/329, 330; 205/122

[56] References Cited

U.S. PATENT DOCUMENTS 5,527,649 6/1996 Sato et al. ................................ 430/7

FOREIGN PATENT DOCUMENTS 61-270701 12/1986 Japan .
61-281220 12/1986 Japan .

*Primary Examiner*—John A. McPherson
*Attorney, Agent, or Firm*—W. Wayne Liauh

[57] ABSTRACT

An improved method for making color filter plates from anionic electrocoats is disclosed. It comprises the steps of: (a) forming a positive photoresist layer on an electrically conductive transparent glass substrate; (b) exposing the portions of the glass substrate to be electrodeposited with a designated color electrocoat by removing corresponding portions of the positive photoresist layer using a photo-masked light exposure procedure followed by a development procedure with a developer solution; (c) electrodepositing the designated color electrocoat on the exposed portions of the glass substrate; (d) performing a flood exposure on remaining portions of the positive photoresist; (e) performing a postbake procedure by heating the glass substrateto thereby harden the color electrocoat; (f) using a basic developer solution to remove the remaining portions of the positive photoresist; and (g) repeating steps (a) through (f) until all the desired electrocoats are electrodeposited on the glass substrate. The flood exposure step causes the photoresist to undergo a chemical reaction so that it will not crosslink during the postbake step and thus can be readily removed in step (f).

20 Claims, 5 Drawing Sheets

METHOD FOR PRODUCING COLOR FILTERS BY THE USE OF ANIONIC ELECTROCOATS

FIELD OF THE INVENTION

The present invention relates to an improved method for producing color filters. More specifically, the present invention relates to an improved method for making color filters which can be used in conjunction with liquid crystal or image sensor in making video monitors, color display devices, television screens, and color image scanners.

BACKGROUND OF THE INVENTION

A color liquid display device contains a liquid crystal and a color filter plate as its constitutional components for controlling the transmission or reflection of light. The color filter plate, which contains red, green and blue color filters, and is prepared by forming red-, green-, and blue-colored image elements and a black matrix on a conductive glass substrate, is one of the most expensive components of the color liquid display displace. The reasons for its high cost can be attributed, at least in part, to the complicated manufacturing process involved, the high raw material cost, and the low utilization rate of the raw material.

Currently, at least four methods have been taught in the prior art for making color filters. These include: (1) dyeing, (2) printing, (3) pigment dispersion, and (4) electrodeposition. Among these methods, the pigment dispersion method is believed to be the most widely-used method. However, the pigment dispersion method suffers the problems of high manufacturing cost and low raw material utilization rate as discussed described above. The electrodeposition method has been recognized as being capable of resulting in lowered cost; however, it suffered from other problems, most notably the incompatibility problems that have been observed between the raw materials used in the process. For example, when an anionic electrodeposition resin is paired with a positive photoresist to coat on the entire surface of an ITO glass, the anionic resin is often attacked by the developer solution, which is used to dissolve the photo-exposed positive photoresist. On the other hand, if a cationic electrodeposition resin is paired with a positive photoresist, another problem associated with the blackening of the ITO glass would arise. Some of these problems may be ameliorated by etching the ITO glass into a stripe pattern (i.e., containing a plurality of isolated and elongated stripes), prior to connecting the ITO glass to the electrodes to proceed with the electrodeposition process. However, this technique creates difficulties in forming the black matrix, which contains a rectangular frame and other line boundaries to improve the sharpness of the color filters.

In U.S. Pat. No. 4,820,619, the content thereof is incorporated herein by reference, a photosensitive composition is disclosed for use in preparing a color filter which contains a copolymer of glycidyl (meth)acrylate or glycidyl ($\alpha$-methyl) vinyl ether with a (meth)acrylic amide or ester having a quaternary ammonium salt structure, and an aromatic azide as a photosensitizer. U.S. Pat. No. 4,837,098, the content thereof is incorporated herein by reference, discloses a colored filter layer comprises three groups of filter picture elements having spectral characteristics respectively corresponding to red, green and blue. Each group of filter picture elements (R, G, B) are made of polyimide resin and dye contained therein. Because of the relatively inadequate light and heat resistances of the dyeing materials, the dyeing method has been pretty much discarded by the manufacturers.

The printing method uses pigment as the raw material, thus it does not experience the heat resistance problem experienced by the dye rag method. However, the relatively poor resolution of the printing method, which is typically coarser than 100-µm, does not satisfy the needs of most manufacturers. The pigment dispersion method can be classified into two major types: etching method and photo-imaging method. The etching method has the advantage that it utilizes color dyes that exhibit improved heat-resisting characteristic. However, because of the relatively complicated process involved, and the somewhat excessive raw material requirement, the etching method has gradually lost its favor. The photo-imaging method utilizes a photosensitive resin, and is the most popular method at the present time. U.S. Pat. No. 5,085,973 and Japan Patent 2-208602, the contents thereof are incorporated herein by reference, disclose the steps and materials generally involved in the photo-imaging process. Because of its high resolution, better than 10-µm, and the high heat resistance of its constituent coloring material, the photo-imaging process has been widely accepted by the industry. One of the drawbacks of the photo-imaging process, however, is that large amounts of the pigments, typically more than 90%, are wasted. Thus, the photo-imaging process was significantly more expensive than other processes. It has been attempted to employ other more precise coating methods, such as roller coating method, to replace the traditional spin coating method, so as to reduce the amount of the expensive pigments that because waste. However, these coating methods do not provide enough flatness, and the attempts were largely unsuccessful.

In accordance with the shape of the transparent conductive substrate (which is typically comprised of indium-tin oxide, or ITO), the electrodeposition coating process can be classified into two main types: "ITO with pattern" (or the "patterned ITO" process) and "ITO without pattern" (or the "patternless ITO" process). It should be noted that the term ITO is used here to represent, in a very broad sense, the transparent conductive substrate, because of the prevalent use of the indium-tin oxide material for forming the transparent conductive substrate. Of course, an "ITO", according to this description, can be made of other transparent conductive materials.

The patterned ITO process was developed earlier than the patternless ITO process. U.S. Pat. No. 4,812,387, the content thereof is incorporated herein by reference, describes an example of the electrodeposition coating process, by which a a light-shielding electrodepositing coating composition is first formed in a transparent electrically conductive circuit pattern so as to suppress the reaction of a photo-setting material against light which is to be applied to the electrodeposition coating. With the electrodeposition coating processes, a transparent electrode is prepared by patterning a transparent electrically conductive film (typically an indium-tin oxide, or ITO) which is deposited on a substrate and serves as an electrode, and an electric voltage is applied only to a portion of the patterned transparent electrode which is to be dyed in the same color. The substrate is then immersed in a coloring electrodeposition bath (i.e., an electrolyzing bath) containing appropriate polymers and pigment dispersed in water, and a colored layer is then formed by electrodeposition. This completes the formation of the first color filter (or the first electrocoat). Thereafter, electric voltage is similarly applied only to another portion of the substrate which is to be dyed with a different color, and the substrate is then immersed in another colored electrodeposition bath for forming a different color layer via electrodeposition. This procedure is repeated until all the desired colored layers are formed. In this process, because the colorants are pigments, the color filters so made exhibit high heat resistance. Furthermore, because the conductive layer is formed using a photo-imaging procedure, resolution can be better than 10-μm. Another distinct advantage of the electrodeposition process over the pigment dispersion process, is that the utilization rate of the pigments can be as high as 98%, thus it presents the advantage of having superior cost-effectiveness than the pigment dispersion process. However, in the electrodeposition process, because the conductive layer having the same color pixels must be contiguous, the color pixels are typically arranged in straight lines (i.e., a stripe pattern). Thus this process lacks the freedom enjoyed by other processes, which allow the color pixels to be arranged generally in any desired pattern. Furthermore, because the color pixels are arranged in stripes of straight lines, additional steps are required to form the black matrix. Japan Patent 61-203403 discloses a multiple photo-imaging process for forming the black matrix. This results in increased production cost. The electrodeposition process is also described in, for example, U.S. Pat. Nos. 4,781,444, 5,206,750, and 4,617,094, the contents thereof are incorporated herein by reference.

With the patternless ITO method, which does not require the etching of an ITO pattern, the conductive ITO layer is first coated with a photoresist layer. After exposure and development, a conductive ITO layer having exposed areas corresponding to the intended positions of pixels of the same color is developed. The undeveloped photoresist serves as an insulation layer. A color pigment is then electrodeposited onto the exposed ITO layer to form a color layer. This procedure is repeated until all the red, blue, and green color pixels are coated, via electrodeposition, on the ITO layer. This method retains the main advantage of the electrodeposition method, in that it provides high pigment utilization rate, while allowing the pattern and arrangements of the color pixels to enjoy a high degree of design flexibility. There are, however, several drawbacks with the patternless ITO method which are difficult to overcome. For example, because the patternless ITO method uses the photoresist as the insulation layer, the coloring resins are subject to attacks by the developer solution when anionic coloring resins are used. While the resistance (with respect to the basic developer solution) of the coloring resin can be improved by increasing the hardening temperature (to above 120° C.), most positive photoresists (which typically belong to the quinodiazide type) will encounter a thermal crosslinking reaction when temperature reached 120° C., thus making it difficult to remove the exposed photoresist. To overcome this problem, U.S. Pat. No. 5,439,582 and Japan Patent No. 5-93807 disclosed methods which utilized low-temperature reactive electrodepositing resins as well as other more expensive positive photoresists. The low-temperature reactive electrodepositing resins, however, caused other problems. For example, it reacted with the electrodepositing tank fluid, and thus shortened the useful life thereof. Additionally, there is very limited selection and supply of other commercially available positive photoresists. Because of these problems, artionic electrodeposition method is seldom used in the industry.

A number of transfer printing techniques have been taught in the art to prevent the attack on the anionic deposited resin by the developer solution. These include the methods disclosed in U.S. Pat. Nos. 4,853,092, 5,314,770, 5,385,795, and 4,902,592, Japan Patent No. 5-164913, and European Pat. No. 0299508, etc. The contents of these teachings are incorporated herein by reference. However, the transfer printing techniques often result in inadequate precision and adversely affect the yield rate. Another method to avoid the attack by the developer solution is to use cationic electrodepositing coloring resins. This method is taught in, for example, U.S. Pat. No. 5,214,542, Japan Patent 4-324801, and European Pat. 0587033, the contents of these teachings are incorporated herein by reference.. However, the cationic resins often caused the ITO layer to be subject to a reduction reaction and become darkened. This causes the light transmittance to be greatly reduced.

U.S. Pat. No. 5,186,801 discloses a method by which the electrodepositing resin was formulated into a photosensitive resin which will harden upon exposure to light. This modification may eliminate the problem associated with the attach by the developer solution; however, the resultant photoresitive resin often provides relatively poor resolution; this greatly diminishes the effectiveness, thus the commercial applicability, of this method.

SUMMARY OF THE INVENTION

The primary object of the present invention is to provide an improved method for making color filters using anionic electrocoats, or anionic electrodepositing color resins. More specifically, the primary object of the present invention is to provide an improved method for making color filters using highly transparent anionic electrocoats, while eliminating the problems of chemical attacks on the electrocoats by the photoresist developer solution, as experienced in the prior art methods.

In the present invention, after an intended anionic electrocoat is electrodeposited on the conductive glass, the photoresist is subject to a predetermined amount of photo exposure energy under a flood exposure condition, followed by a postbake treatment, so as to allow the remaining portion of the photoresist layer to be removed using a developer solution, while leaving the anionic electrocoats unharmed. After the removal of the photoresist, a new photoresist is coated on the conductive glass containing the already electrodeposited electrocoat(s) and is then expoused under a photomask so as to allow a new electrocoat to be electrodeposited. These steps are repeated until all the color filters are formed on the conductive glass. In other words, the process disclosed in the present invention involves the novel sequence of(prebake→flood exposure→postbake), after an electrocoat is electrodeposited, so as to effectively and completely remove the photoresist while leaving the electrocoat(s) unharmed by the developer solution. The present invention exhibits several superior advantages over those processes disclosed in the prior art by allowing the anionic electrocoats to retain a high transparency; it also allows the color pixels to be arranged according to any desired patterns, as well as providing excellent pigment utilization rate.

In all conventional processes, the electrocoats remain a loosely consolidated gel structure after the electrodeposition. They are susceptible to attacks by the developer solution (i.e., dissolved by the developer solution). A heat treatment (the so-called postbake) is required to harden the electrocoats and thus improve their chemical resistance. However, the heat treatment will also cause the positive photoresist that has been formed on the conductive substrate to undergo thermal crosslinking. This causes it very difficult for the photoresist to be peeled off, and some remnants will remain on the conductive glass in the form of scums which adversely affect the subsequent electrodeposition of other electrocoats. In the present invention, to overcome this problem, the photoresist is subject to a flood exposure prior to the postbake step. This extra step causes the quinonediazides groups to decompose into carboxyl groups, thus eliminating the occurrence of thermal crosslinking. The entire photoresist layer will be peeled off after the flood exposure. The carboxyl groups so formed will also facilitate the removal of the photoresist after the flood exposure. The amount of the flood exposure energy varies according to the type of photoresist used. Typically, a flood exposure energy of 40 mJ/cm$^2$ or above is adequate. The photoresist can be peeled off using a variety of solutions, such as sodium hydroxide, sodium metasilicate, potassium hydroxide, tetraalkylammonium hydroxides, etc., at concentrations between 2 and 5 wt %.

The peeling-off of a photoresist layer completes the preparation of one of the color filters. Typically, a color filter plate consists of three color filters: red, green, and blue. Thus the above steps are repeated until all the three color filters are formed on the conductive transparent substrate. In two alternative embodiments, in which a transparent overcoat is to be applied on the external surface of the color filter plate or when the most exterior layer does not have to be colorless, the steps of flood exposure and peeling-off are not required for the third color filter. The third electrocoat can be deposited directly onto the exposed conductive transparent substrate to form the third color filter. This simplifies the operational procedure.

While the prior art has taught away from using anionic electrocoats in making color filters, the novel steps disclosed in the method of the present invention allow anionic electrocoats to be advantageously used to make color filters without encountering the problems observed in the prior art processes. With the present invention, great flexibility can be achieved because the color pixels can be arranged in any desired manner. The method disclosed in the present invention also allows excellent precision and resolution to be obtained. Furthermore, because excellent pigment utilization rate can be achieved, the process disclosed in the present invention also provides excellent cost-effectiveness and great economic incentives.

BRIEF DESCRIPTION OF THE DRAWING

The present invention will be described in detail with reference to the drawings showing the preferred embodiment of the present invention, wherein.

DETAILED DESCRIPTION OF THE PREFERRED EMBODIMENT

The present invention discloses an improved process for making color filters using anionic electrocoats. The process disclosed in the present invention allows highly transparent anionic electrocoats to be used for making color filters using, while at the same time, it eliminates many of the problems encountered in the prior art, most notably the problem of chemical attacks on the color electrocoats by the photoresist developer solution.

In all the conventional electrodeposition processes for making color filters, the electrocoats remain an unconsolidated gel structure after they electrodeposited, thus they are susceptible to attacks by the developer solution. A heat treatment is required to harden the electrocoats and improve their chemical resistance. However, the heat treatment could cause a crosslinking of the positive photoresist, making it difficult to be completely peeled off. This problem has greatly discouraged the use of aninoic electrocoats for making color filters. In the present invention, the color electrocoats and the photoresist were subject to a flood exposure prior to the postbake step causing the quinonediazides groups to decompose into carboxyl groups, thus eliminating the peeling-off problem caused by the thermal crosslinking of the quinonediazides groups. The amount of the flood exposure energy varies according to the type of photoresist used. Typically, a flood exposure energy of 40 mJ/cm$^2$ or above would suffice. The photoresist can be peeled off using a number of solutions, such as sodium hydroxide, potassium hydroxide, tetramethyl ammonium hydroxide, etc., at concentrations between 2 and 5 wt %.

Figure 1:
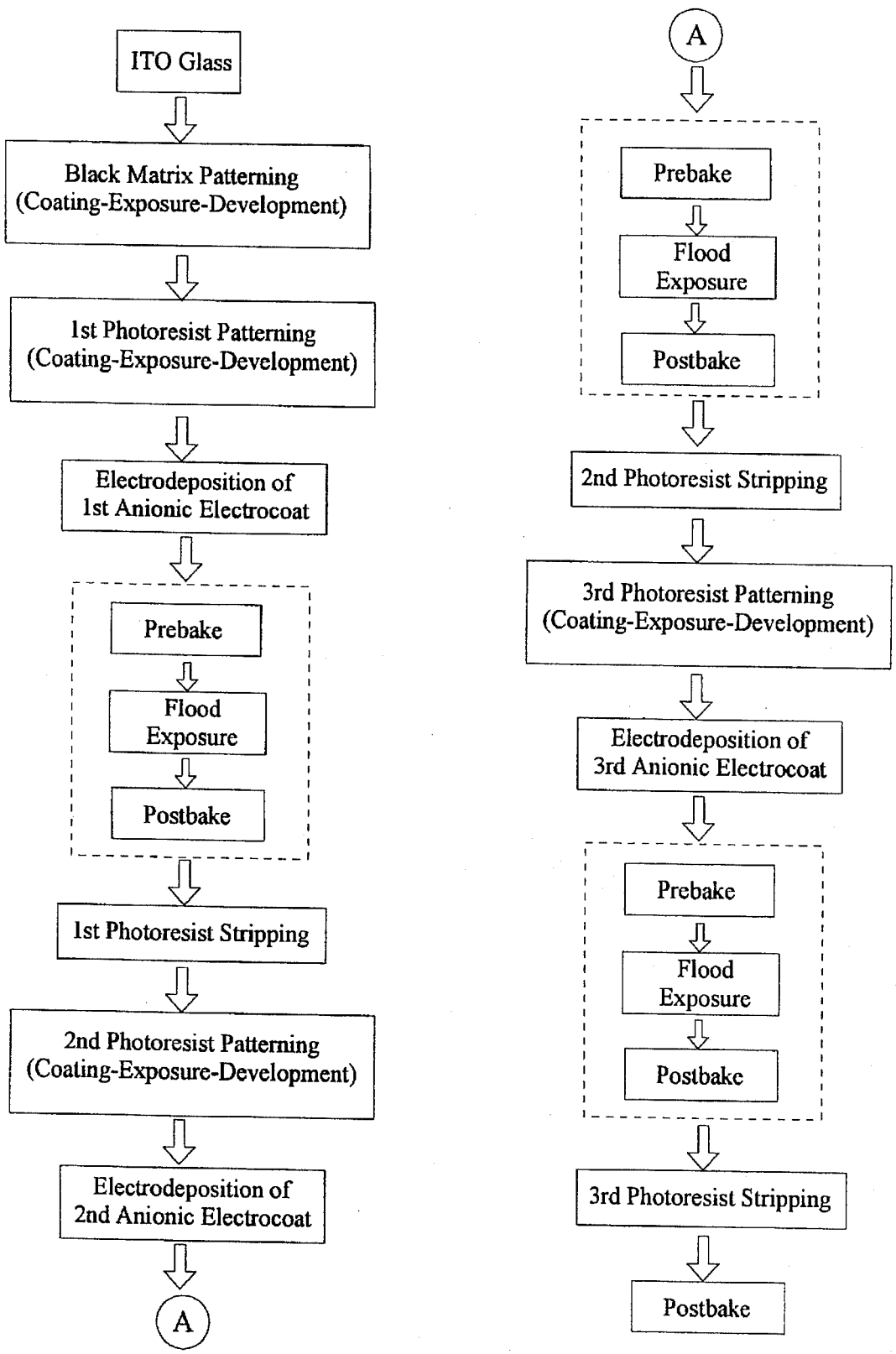
FIG. 1 is flowchart diagram of the steps according to the first preferred embodiment of the process disclosed in the present invention for manufacturing color filters by electrodepositing anionic electrocoats on a patternless-ITO.

FIG. 1 is flowchart diagram of the steps according to the first preferred embodiment of the process disclosed in the present invention by which color filters were manufactured by electrodepositing anionic electrocoats on a patternless-ITO. The anionic electrocoats are electrodeposited on a transparent conductive substrate, which requires both a high degree of light transmissibility and a high degree of electrical conductivity. Because of the high precision required of the liquid crystal display devices, dimensional stability and stability in the cell gap are two important considerations. As a result, it is often preferred that the conductive substrate be made of glass. The conductive layer typically is made of indium-tin oxide (i.e. tin-doped indium oxide), or ITO, which has a light transmissibility of at least 80%. Because of the prevalent use of indium-tin oxide as the conductive layer material, the term ITO is commonly used to represent, in a very broad sense, the conductive transparent layer itself. Of course, the conductive transparent layer can be made of other transparent conductive materials, but it may still be called an ITO layer. In order to minimize the effect of uneven resistance in the conductive layer which may affect the homogeneity of the electrocoats, it is preferred that the conductivity of the ITO layer be less than the equivalent of 15 ($\Omega$/square). However, the conductivity of the ITO layer should not be too low, because too thick an ITO layer can cause a decrease in the light transmissibility (conductivity is inversely related to thickness).

The color filter plate of a liquid crystal display device consists of three color filters: red, green, and blue. The color pixels are arranged in stripes or in a checkboard pattern. In order to improve the sharpness of image and visual contrast, a black matrix is often formed between the different color pixels so that the different color pixels are separated. The black-colored matrix (i.e., black-hued matrix), which is also arranged either in stripes or in a checkboard pattern, can be made from metals, such as chromium or nickel, carbon black, or black-hued organic materials. If it is made of metallic materials, typically a sputter coating method or electrodeposition method would be used. On the other hand, if an organic material is used, typically, the black-colored matrix is formed using a black-colored pigment dispersed in an organic resin, which is then coated on the conductive substrate by spin coating method or electrodeposition. Both materials have their advantages and disadvantages. The metal material provides high light-shield to stop back light; however, its high reflectivity may affect the chrominance of the colors. On the other hand, the organic materials typically do not provide the same degree of light-shielding effect. However, the organic materials exhibit an advantageously low reflectivity. In the present invention, a photosensitive resin containing black pigments dispersed therein was used as the material for making the black matrix.

In the present invention, a positive photoresist was used to form an insulation layer during the deposition of the electrocoats to protect the unintended portion (i.e., the portion of the conductive substrate which is not intended to be electrodeposited with the color resin). The positive photoresist mainly comprised of a cresol novolac resin and a quinonediazide compound. Upon exposure to light, the quinonediazides group is photo-decomposed into carboxyl group, such that the photoresist is now soluble in a basic developer solution. The unexposed portion of the photoresist remains hydrophobic and will be dissolved by the basic developer solution. Because the unexposed photoresist could be subject to a thermal crosslinking reaction at elevated temperatures and thus lose its photodecomposibility, typically, the prebake temperature is controlled at temperatures below 100° C. The crosslinking of the photoresist also made it very difficult to be peeled off, causing the so-called scums to be left on the conductive substrate. At temperatures above 100° C., thermal crosslinking of the positive photoresist would be observed. The novel sequence of (prebake→flood exposure→postbake) after an electrocoat is electrodeposited as disclosed in the present invention, caused the quinonediazide groups to be photo-decomposed into carboxyl groups, which will not react with the quinonediazide group until temperature is raised above 200° C. Thus no thermal crosslinking was observed in the present invention, and the entire photoresist layer can be easily peeled off from the conductive substrate.

Preferably, the positive photoresist is prebaked at temperatures between 80° and 100° C. The thickness of the photoresist layer is controlled according to the viscosity of the photoresist solution and the rpm of the spinning coating device. Preferably, the photoresist solution has a viscosity between 5 and 60 cps, and the spin coating device is controlled at a rotation speed of 1,200–4,000 rpm, so that the thickness of the photoresist layer is controlled between 1.0 μm and 3.0 μm. The amount of exposure is preferably controlled to be between 40 and 200 mJ/cm$^2$. Inadequate exposure would cause scums to remain on the conductive substrate. On the other hand, excessive exposure energy may cause the edge lines to be affected. Preferably, the developer solution is selected from the group consisting of sodium hydroxide, potassium hydroxide, sodium metasilicate, tetramethyl ammonium hydroxide, etc, at a concentration between 0.5 and 3 wt %.

After development, the exposed portions of the conductive substrate were electrodeposited with an electrocoat (i.e., a coloring resin), which was an anionic coloring resin composition containing an acrylic resin, a thermosetting resin (preferably a reelamine resin), one or more pigments, a neutralizing agent, a solvent, etc. The acrylic resin is a carboxyl group containing anionic copolymer prepared from a plurality of acrylic monomers. The preferred acrylic monomers include:

(1) acrylic monomers containing carboxyl groups: such as acrylic acid and methacrylic acid;
(2) acrylic monomers containing hydroxy groups: such as 2-hydroxyethyl acrylate and 2-hydroxyethyl methacrylate;
(3) acrylic monomers containing aromatic groups: such as styrene, benzyl acrylate, benzyl methacrylate, and 2-phenoxy-ethylacrylate; and
(4) acrylic monomers containing alkyl groups: such as methyl methacrylate, methyl acrylate, butyl acrylate, and butyl methacrylate.

A mixture containing an appropriate combination of the above monomers was prepared, followed by solution polymerization to form the acrylic resin. Preferably, the polymerization initiators are selected from the group consisting of azobisisobutyronitride and benzoyl peroxide.

Melamine resins are the preferred thermosetting resin because of their high stability at room temperature and their high reaction rate at elevated temperatures. The melamine resin reacted with the carboxyl groups and hydroxy groups of the acrylic resin at elevated temperatures with a high degree of crosslinking, and the resultant thermoset resin exhibited excellent transparency. Preferably, the amount of the thermosetting resin is about 10–40 wt% of the acrylic resin.

In the present invention, it is preferred that the pigments have high heat and light resistance, high transparency, and excellent dispersivity. Preferred pigments include: Pigment Red-177, Pigment Red-209, Pigment Red-149, Pigment Green-36, Pigment Blue-1523, Pigment Blue-1524, Pigment Blue-1526, Pigment Yellow-109, Pigment Yellow-139, Pigment Yellow-83, Pigment Yellow-23, etc. These pigments were supplied by Ciba-Geigy, BASF, ICI, Hoechst, etc.

When purchased, the pigments were in a coagulated state. In order to improve their transparency, they were milled into smaller particles using a sand mill. Other devices, such as ball mill, attritor, triple-roll mill, etc., can also be used. Further, the pigments were added with an appropriate dispersion agent, a leveling agent, a coupling agent, etc., to improve their rheological properties. These additives have been well documented in the art and are not repeated here. Preferably, the amount of pigments is about 15–30 wt % of the acrylic resin. Precipitation would be observed if the pigment concentration was too high; on the other hand, if the pigment concentration was too low, the color coat would not provide enough color saturation.

The anionic coloring resin also contained a neutralizing agent, which neutralized with the carboxyl groups in the acrylic resin so as to form a charged resin and allow the coloring resin to become emulsified in solution. Preferred neutralizing agents include: ammonium hydroxide, triethyl amine, triethanol amine, etc. Preferably, the amount of the neutralizing agent is about 40–100 wt % of the amount of acrylic resin.

An appropriate solvent was added to the anionic coloring resin to stabilize the emulsified solution, prevent precipitation, and control the thickness of the electrocoat. Preferred solvents include: methyl ethyl ketone, isopropyl alcohol, n-butanol, propylene glycol monomethyl ether, ethylene glycol monobutyl ether, etc. The amount of the organic solvent is determined by the intended viscosity of the electrocoat composition.

The anionic electrocoating solution was prepared first by milling the pigments into very small particles, then the acrylic resin, melamine resin, and solvent mentioned above were added. Thereafter, a neutralizing agent was added. After thorough mixing, deionized water was slowly added, in a drop-by-drop manner, while the stirring continued. If the deionized water was added too fast, large resinous agglomerates were formed, causing filtration problems.

After the development of the photoresist, the conductive substrate in electrodeposition tank was arranged as the anode, and a stainless steel was used as the cathode. The two electrodes were separated by a distance of more than 10 cm to avoid short circuit. Each of the color pixels had the shape close to a rectangle with a side length of about 80–150 µm. The electrical voltage applied to the electrodes varied according to the required thickness of the electrocoat and composition of the electrodeposition composition. Typically, the applied voltage ranged between 20–80 volts. Too high a voltage would result in too large the thickness of the electrocoat. Whereas, if the voltage was too low, it would be difficult for the pigment to precipitate with the resin, causing inadequate color saturation. Typically, the electrical voltage was applied for a duration of about 10–60 seconds. If the duration was too short, uneven thickness of the electrocoat would result. On the other hand, if the duration was too long, the thickness of the electrocoat would be too thick, thus adversely affecting the production yield. It is preferred that the thickness of the electrocoat be controlled between 1.0 and 2.5 µm, by judiciously adjusting the electrical voltage and the duration of applied electrical charge.

The peeling-off of a photoresist layer completes the preparation of one of the color filters. Typically, a color filter plate consists of three color filters: red, green, and blue. Thus the above steps are repeated until all the three color filters are formed on the conductive transparent substrate. In two alternative embodiments, in which a transparent overcoat is to be applied on the external surface of the color filter plate or when the most exterior layer does not have to be colorless, the steps of flood exposure and peeling-off are not required for the third color filter. The third electrocoat can be deposited directly onto the exposed conductive transparent substrate to form the third color filter. This simplifies the operational procedure.

The method disclosed in the present invention allows anionic electrocoats to be advantageously used to make color filters without encountering the problems observed in the prior art processes. With the present invention, great flexibility can be achieved because the color pixels can be arranged in any desired manner. The method disclosed in the present invention also allows excellent precision and resolution to be obtained. Furthermore, because excellent pigment utilization rate can be achieved, the process disclosed in the present invention also provides excellent cost-effectiveness and great economic incentives.

Figure 2:
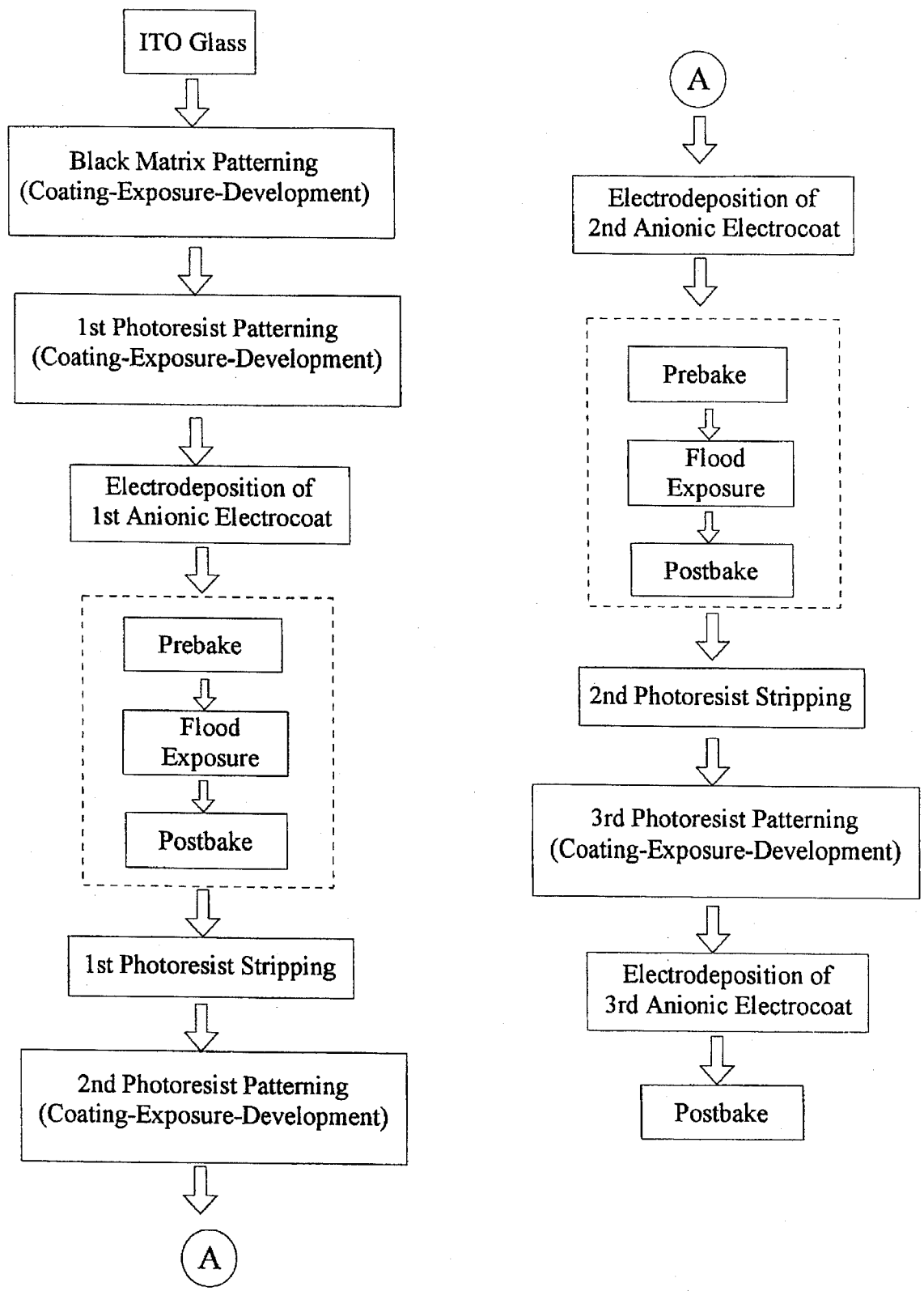
FIG. 2 is flowchart diagram of the steps according to the second preferred embodiment of the process disclosed in the present invention, in which the steps of flood exposure and peeling-off of the photoresist prior to the electrodeposition of the third color electrocoat are eliminated.
Figure 3:
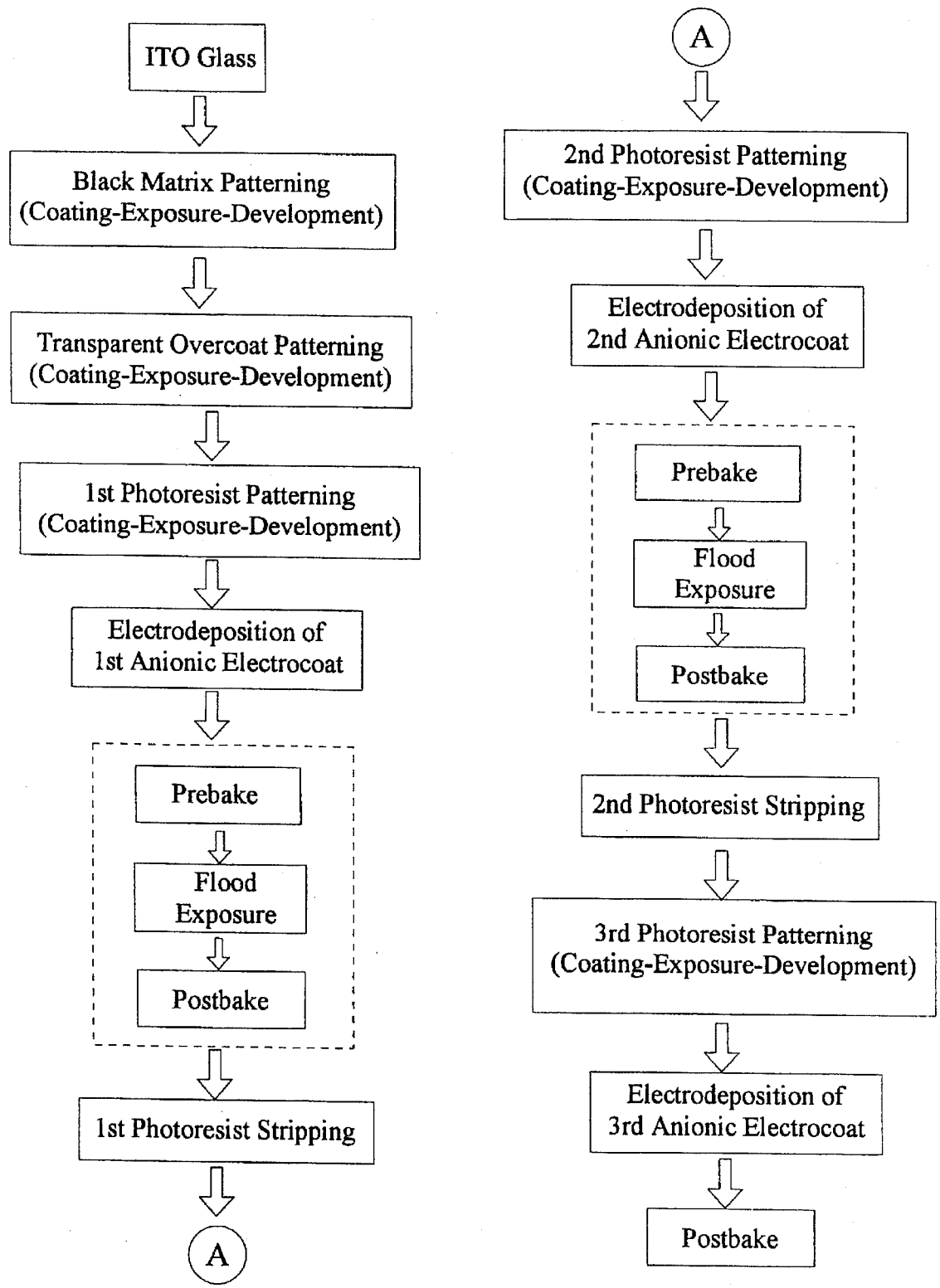
FIG. 3 is flowchart diagram of the steps according to the third preferred embodiment of the process disclosed in the present invention, in which an extra step to provide a transparent overcoat patterning is included, and the steps of flood exposure and peeling-off of the photoresist prior to the electrodeposition of the third color electrocoat are eliminated.
Figure 4:
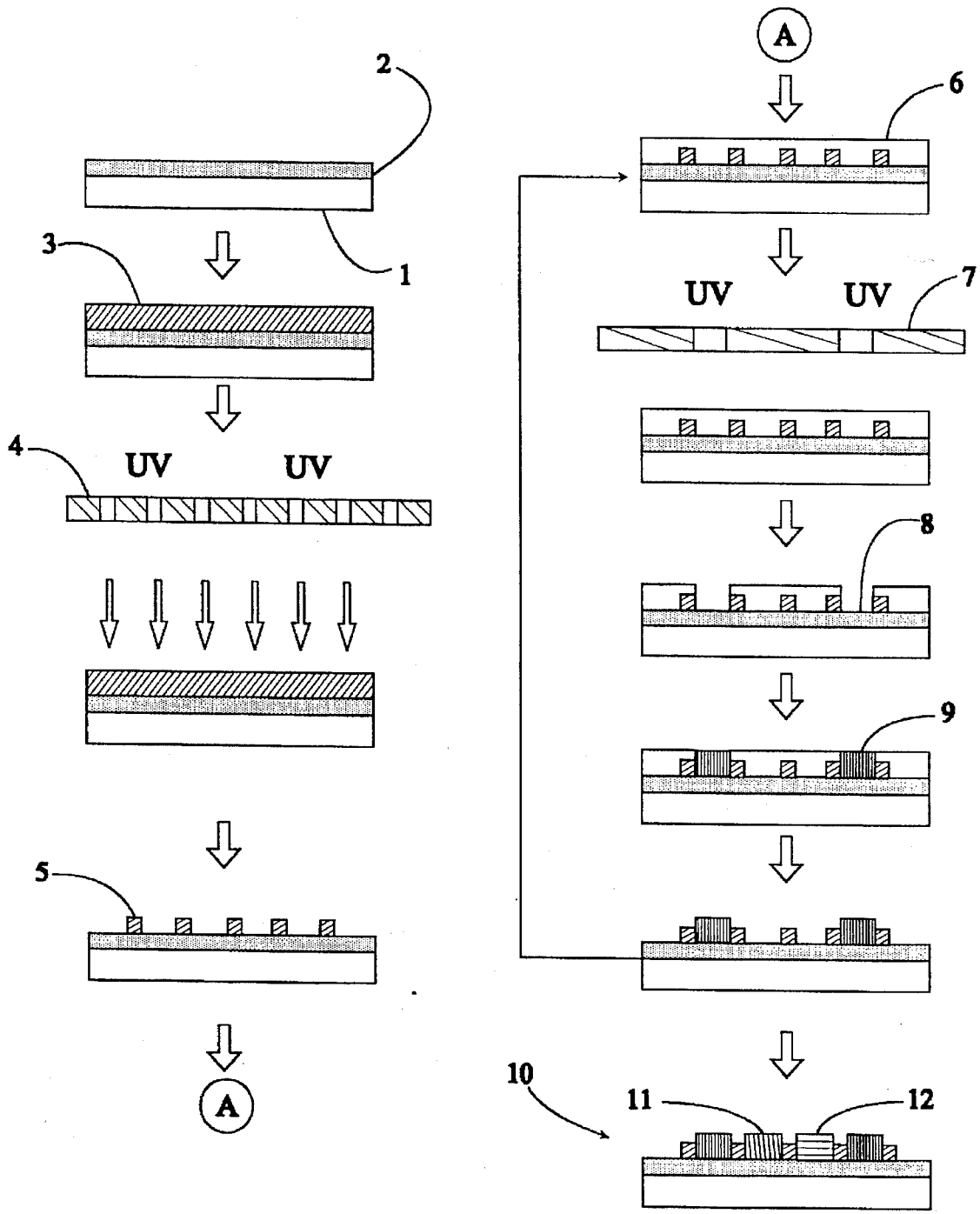
FIG. 4 is schematic diagram of the steps according to the first preferred embodiment of the process disclosed in the present invention.

FIG. 2 is flowchart diagram of the steps according to the second preferred embodiment of the process disclosed in the present invention, in which the steps of flood exposure and peeling-off of the photoresist prior to the electrodeposition of the third color electrocoat are eliminated. FIG. 3 is flowchart diagram of the steps according to the third preferred embodiment of the process disclosed in the present invention, in which an extra step to provide a transparent overcoat patterning is included, and the steps of flood exposure and peeling-off of the photoresist prior to the electrodeposition of the third color electrocoat are eliminated. FIG. 4 is schematic diagram showing the "side views" of the steps according to the first preferred embodiment of the process disclosed in the present invention. First an electrically conductive transparent was obtained by forming an ITO layer 2 on a glass substrate 1. Then a black photoresist 3 was formed on the ITO layer. In step 3, the black photoresist was subject to UV exposure via a photomask 4, to form black matrix, as shown in step 4. In step 5, a positive photoresist 6 was coated on the ITO layer. The positive photoresist was subject to UV exposure via another photomask 7 as illustrated in step 6. In step 7, it was illustrated that the designated portions 8 of the ITO layer were exposed after development. A red electrocoat 9 was electrodeposited on the exposed portions of the ITO layer in step 8. After flood exposure, postbake and stripping, the photoresist was removed from the ITO layer, as illustrated in step 9. Steps 5 through 9 were repeated until the green and blue electrocoats, 11 and 12, were electrodeposited on the ITO layer, to form a color filter plate 10.

The present invention exhibits several superior advantages over those processes disclosed in the prior art by allowing the anionic electrocoats to retain a high transparency; it also allows the color pixels to be arranged according to any desired patterns, as well as providing excellent pigment utilization rate. But most importantly, the novel steps disclosed in the present invention allow color filters to advantageously made from anionic electrocoats, the use of which has been discouraged by the prior art teachings.

Preferably, the electrocoat is electrodeposited on said glass substrate under a voltage of about 15 to 80 volts for a duration of about 10 to 120 seconds, and the flood exposure is conducted at an exposure energy of at least about 20 mJ/cm$^2$, or more preferably at least about 40 mJ/cm$^2$. The postback step is preferably conducted at temperatures between about 120° C. and about 220° C., or more preferably at temperatures between about 130° C. and about 160° C. Also, preferably, the developer solution is a basic developer solution selected from the group consisting of sodium hydroxide, sodium metasilicate, potassium hydroxide, and tetramethylammonium hydroxide solutions at concentrations between 2 and 5 wt %.

One of the key elements of the present invention is that the positive photoresist is only chemically modified (so that it will not cross-link during the subsequent postback step), but not decomposed (so as to be developed), during the flood exposure. As a result, the exposure energy during the flood exposure is substantially lower than the typical exposure energy of 100 mJ/cm$^2$. Furthermore, because the positive photoresist is only chemically modified but not decomposed during the flood exposure step, the flood exposure step can be moved to before the electrodeposition of the color colorcoat.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Preparation of Acrylic Resin

In a four-mouth reactor vessel, a condensor tube, a thermometer, a feed tube, and a stirring rod were inserted, respectively. The reactor vessel was heated in an oil bath and the temperature was maintained at 100° C.

338.0 g of propylene glycol monomethyl ether was charged into the reactor and purged with nitrogen. Then a mixture containing the following ingredients was added;

| | |
|---|---|
| methacrylic acid: | 390.0 g |
| 2-hydroxyethyl acrylate: | 177.0 g |
| 2-phenoxyl ethyl acrylate: | 1,735.0 g |
| Butyl acrylate: | 1,152.0 g |
| Methyl methacrylate: | 600.0 g |
| Axobisisobutyronitride | 30.0 g |
| Propylene glycol monomethyl ether | 1,738.0 g |

The mixture solution was added, drop by drop, into the reactor via the feed tube. The total charge process took about 200 minutes. After the charge, the reactor was maintained at the same temperature for 3 hours before it was lowered to room temperature. A transparent acrylic resin was obtained, which had a weight average molecular weight of about 31,000.

EXAMPLE 2

Preparation of the Electrodepositing (Electrocoating) Composition

An electrocoating solution containing the ingredients as shown in Table 1 was prepared. After thorough mixing, it was poured into a sand mill and milled for about 10 hours to reduce the particle size of the pigments. The milled electrocoating composition was then poured into a mixer, into which ammonium hydroxide was added and the mixture was throughly mixed. Thereafter, deionized water was slowly added, drop by drop, into the mixture. The stirring continued for more than two hours. After filtration, an anionic electrocoating composition was obtained.

TABLE 1

| | Weight (g) | | |
|---|---|---|---|
| Color | Red | Green | Blue |
| Anionic Polymer Solution | 214.0 | 214.0 | 214.0 |
| Melamine Resin | 40.0 | 40.0 | 40.0 |
| Pigment Red-177* | 31.0 | | |
| Pigment Green-36** | | 28.0 | |
| Pigment Blue-1526*** | | | 24.0 |
| Propylene Glycol Monomethyl Ether | 60.0 | 60.0 | 60.0 |
| $NH_{3(aq)}$ (28%) | 9.0 | 9.5 | 9.5 |
| Deionized Water | 2,700.0 | 2,600.0 | 2,700.0 |

*Ciba-Geigy
**BASF G-9361
***BASF B-6700

EXAMPLE 3

Preparation of A Color Filter Plate

A positive photoresist, which comprised of a cresol novolac resin and a quinonediazide compound, was coated onto an ITO glass (Merck Co., 1.1 ram, 10 Ω/square), using a spinning coating technique at a rotational speed of 2,500 rpm. The coated ITO glass was placed inside a 90° C. oven and heated for 10 minutes. A photomask having repeated fine lines and small squares (5–150 μm) was placed on top of the photoresist. The photomask was subject to a photo exposure (a medium pressure mercury lamp) to receive an exposure energy of about 120 mJ/cm$^2$. After the exposure, the ITO glass (containing the photoresist) was treated with a 2 wt % $Na_2 SiO_3$ for 3 minutes for development. The exposed portions of the photoresist were removed during the development step. The once-developed ITO glass was dipped into a electrolysis tank containing the red electrocoating composition prepared in Example 2.

An electrical voltage of 45 volts was applied onto the ITO glass to begin electrodeposition. The electrical voltage was maintained for 15 seconds. This caused the red electrocoating composition to be electrodeposited onto the exposed portions of the ITO glass, with a film thickness of about 2.0 μm. No such film was formed on the portions of the ITO glass protected by the positive photoresist. The electrodeposited ITO glass was removed from the electrolyzing tank, washed (with water), and dried (at 90° C.) for 10 minutes (the prebake step). After cooled to room temperature, the ITO glass was exposed to a medium pressure mercury lamp without any photomask for a flood exposure (the flood exposure step). The exposure energy was about 40 mJ/cm$^2$. During the flood exposure, the quinonediazide groups of the remaining positive photoresist were converted into carboxyl groups. The flood-exposed ITO glass was then subject to a postbake step (i.e., a baking step after exposure), by placing it inside a 120° C. oven for 5 minutes (the postbake step) to cause the anionic electrocoating composition to harden. Because most of the quinonediazide groups have been converted into carboxyl groups after the flood exposure, no observable thermal crosslinking was experienced. After the electrocoating composition was hardened, the ITO glass was placed into a 5 wt % NaOH solution for two minutes, to remove the remaining photoresist. The color electrocoat was left unharmed.

The ITO glass prepared above that already had a red electrocoat (i.e., a red color filter) deposited thereon was coated, for the second time, with a positive photoresist. After the same steps of masked exposure, development, electrodeposition with a green color resin, prebake, flood exposure, and postbake, as described above, the electrocoat was hardened and the positive photoresist was peeled off from the conductive substrate. A green color filter was thus formed on the conductive substrate. The same procedure was repeated to form the blue color filter.

EXAMPLES 4–11

The procedures in Examples 4 through 11 were identical to that described in Example 3, except that at least one of positive photoresists, flood exposure energies, and postbake temperatures was different. These conditions are listed in Table 2. The resolutions (linear resolutions) of the color filters obtained from examples are also listed in Table 2. In all these examples, the resolutions were all better than 20 μm.

TABLE 2

| | Experimental Condition | | | |
|---|---|---|---|---|
| Example | Photo-resist | Exposure Energy (mJ/cm$^2$) | Postbake Temp. (°C.) | Postbake Time (min.) | Result (Resolution*) |
| Ex. 1 | PR-1 | 40 | 120 | 5 | 5 μm |
| Ex. 2 | PR-1 | 120 | 150 | 20 | 5 μm |
| Ex. 3 | PR-1 | 200 | 200 | 40 | 10 μm |
| Ex. 4 | PR-2 | 40 | 150 | 40 | 20 μm |
| Ex. 5 | PR-2 | 120 | 200 | 5 | 10 μm |
| Ex. 6 | PR-2 | 200 | 120 | 20 | 20 μm |
| Ex. 7 | PR-3 | 40 | 200 | 20 | 5 μm |
| Ex. 8 | PR-3 | 120 | 120 | 40 | 10 μm |
| Ex. 9 | PR-3 | 200 | 150 | 5 | 5 μm |

PR-1: Cresol Novolac resin + quinonediazide compound
PR-2: Shipley Co. S1813
PR-3 Dynachem Co. Dynalith OFPR800
*resolution was measured based on the minimum line width of the color filter that can be resolved.

COMPARATIVE EXAMPLES 1–3

The procedures in Comparative Examples 1 through 3 were identical to that described in Example 3, except that the positive photoresists and the postbake temperature may be different, and, more importantly, that none of them included the flood exposure step. These conditions are listed in Table 2. The resolutions (linear resolutions) of the color filters obtained from comparative examples are also listed in Table 3. In all these comparative examples, the resolutions were all worse than 150 μm, and some scums were observed after the positive photoresist was peeled off from the conductive glass.

TABLE 3

| Example | Photo-resist | Experimental Condition | | | Result (Resolution) |
|---|---|---|---|---|---|
| | | Exposure Energy (mJ/cm$^2$) | Postbake Temp. (°C.) | Postbake Time (min.) | |
| Comp. Ex. 1 | PR-1 | 0 | 120 | 40 | >150 μm + scums |
| Comp. Ex. 2 | PR-2 | 0 | 200 | 5 | >150 μm + scums |
| Comp. Ex. 3 | PR-3 | 0 | 150 | 20 | >150 μm + scums |
| Comp. Ex. 4 | PR-1 | 0 | 100 | 2 | some electro-coat was peeled off |

EXAMPLE 12

A black-hued photosensitive coating composition (Fuji-Hunt Co., CK-2000) was coated onto an ITO glass (Merck Co., 1.1 mm, 10 Ω/square), using a spin coating technique at a rotational speed of 1,200 rpm. The coated ITO glass was placed inside a 80° C. oven and heated for 10 minutes. A photomask having the pattern of a designed black matrix was placed on top of the photosensitive black-hued coating composition. The photomask was subject to a photo exposure (using a medium pressure mercury lamp) to receive an exposure energy of about 200 mJ/cm$^2$, which caused a photocuring reaction for the exposed black-hued coating composition. After the exposure, the ITO glass (containing the photoresist) was treated with a 1 wt% KOH to remove the unexposed unhardened portions of the black-hued coating, and a black matrix was formed. The ITO glass was placed inside a 200° C. oven for 30 minutes to completely harden the black matrix.

After cooling, a positive photoresist, which comprised of a cresol novolac resin and a quinonediazide compound, was coated onto the ITO glass containing the black matrix, using a spin coating technique at a rotational speed of 2,500 rpm. The coated ITO glass was placed inside a 90° C. oven and heated for 10 minutes. After the coated ITO glass was removed from the oven and cooled, a photomask having the intended pattern for the red pixels was placed on top of the photoresist. The photomask was subject to a photo exposure (a medium pressure mercury lamp) to receive an exposure energy of about 120 mJ/cm$^2$. After the exposure, the ITO glass (containing the photoresist) was treated with a 2 wt % Na$_2$SiO$_3$ for 3 minutes for development. The exposed portions of the photoresist were removed during the development step. The once-developed ITO glass was dipped into a electrolysis tank containing the red electrocoating composition prepared in Example 2.

An electrical voltage of 45 volts was applied onto the ITO glass to begin electrodeposition. The electrical voltage was maintained for 15 seconds. This caused the red electrocoating composition to be electrodeposited onto the exposed portions of the ITO glass, with a film thickness of about 2.0 μm. No such film was formed on the portions of the ITO glass and the black matrix, both of them were protected by the positive photoresist. The electrodeposited ITO glass was removed from the electrolyzing tank, washed (with water), and dried (at 90° C. for 10 minutes, prebake). After being cooled to room temperature, the ITO glass was exposed to a medium pressure mercury lamp without any photomask for a flood exposure. The exposure energy was about 100 mJ/cm$^2$. During the flood exposure, the quinonediazide groups in the remaining positive photoresist were converted into carboxyl groups. The flood-exposed ITO glass was then subject to a postbake step (i.e., a baking step after exposure), by placing it inside a 135° C. oven for 15 minutes, to cause the anionic electrocoating composition to harden. Because most of the quinonediazide groups have been converted into carboxyl groups after the flood exposure, no observable thermal crosslinking was experienced. After the electrocoating composition was hardened, the ITO glass was placed into a 5 wt % NaOH solution for two minutes, to remove the remaining photoresist. The color electrocoat was left unharmed.

Figure 5:
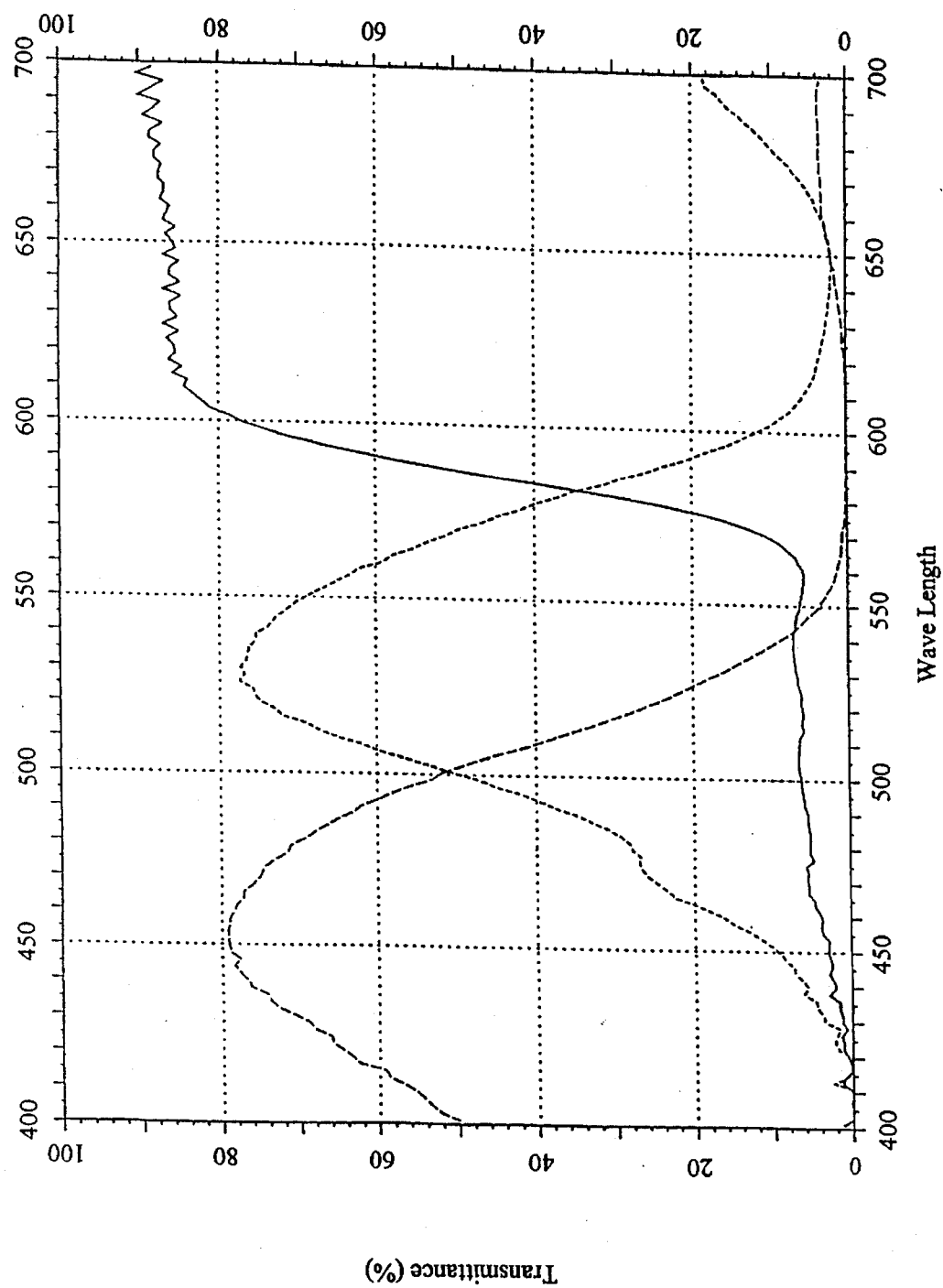
FIG. 5 shows the transmission spectrum through the color filter plate measured from each of the three color layers.

The ITO glass that had a red electrocoat (i.e., a red color filter) and the black matrix was coated, for the second time, with a positive photoresist. After the same steps of masked exposure, development, electrodeposition with a green color resin, prebake, flood exposure, and postbake, as described above, the green electrocoat was hardened and the positive photoresist was peeled off from the conductive substrate. A green color filter was thus formed on the conductive substrate. The same procedure was repeated to form the blue color filter. The final conductive glass substrate, which contained four colored layers of black, red, green, and blue, was subject to a high temperature curing at 200° C. for one hour, to obtain the final product of color filter plate. FIG. 5 shows the transmission spectrum through the color filter plate measured from each of the three color layers. FIG. 5 indicates that excellent light transmissions, at about 80% or better, were obtained through each of the three color filters.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for making color filter plates each having a plurality of color filters comprising the steps of:

(a) forming a positive photoresist layer on an electrically conductive transparent glass substrate;

(b) exposing portions of said glass substrate to be electrodeposited with a designated color electrocoat by removing corresponding portions of said positive photoresist layer using a photomasked light exposure procedure followed by a development procedure with a developer solution, wherein said electrocoat is an anionic electrocoat;

(c) electrodepositing said designated color electrocoat on said exposed portions of said glass substrate;

(d) performing a flood exposure on remaining portions of said positive photoresist;

(e) performing a postbake procedure by heating said glass substrate to thereby harden said color electrocoat;

(f) using a developer solution to remove said remaining portions of said positive photoresist; and (g) repeating steps (a) through (f) until all the desired electrocoats are electrodeposited on said glass substrate;

(h) wherein said flood exposure step causes said photoresist to undergo a chemical reaction so that it will not crosslink during said postbake step and thus can be readily removed in step (f).

2. A method for making color filter plates according to claim 1 which further comprises the step of forming black matrix prior to the formation said positive photoresist layer.

3. A method for making color filter plates according to claim 1 wherein said positive photoresist comprises a cresol novolac resin and a quinonediazide compound.

4. A method for making color filter plates according to claim 3 wherein said flood exposure step causes quinonediazide groups of said positive photoresist to decomposed into carboxyl groups.

5. A method for making color filter plates according to claim 1 wherein said electrocoat is an anionic emulsified solution comprising an acrylic resin, a thermosetting melamine resin, and a pigment.

6. A method for making color filter plates according to claim 1 wherein said electrocoat is electrodeposited on said glass substrate under a voltage of about 15 to 80 volts for a duration of about 10 to 120 seconds.

7. A method for making color filter plates according to claim 1 wherein said flood exposure is conducted at an exposure energy of at least about 20 mJ/cm$^2$.

8. A method for making color filter plates according to claim 1 wherein said flood exposure is conducted at an exposure energy of at least about 40 mJ/cm$^2$.

9. A method for making color filter plates according to claim 1 wherein said postback step is conducted at temperatures between about 120° C. and about 220° C.

10. A method for making color filter plates according to claim 1 wherein said postback step is conducted at temperatures between about 130° C. and about 160° C.

11. A method for making color filter plates according to claim 1 wherein said postback step has a duration of about 5 to 60 minutes.

12. A method for making color filter plates according to claim 1 wherein said developer solution is a basic developer solution selected from the group consisting of sodium hydroxide, sodium metasilicate, potassium hydroxide, and tetramethylammonium hydroxide solutions at concentrations between 2 and 5 wt %.

13. A method for making color filter plates according to claim 1 wherein said color filter plate consists red, green, and blue color filters.

14. A method for making color filter plates according to claim 1 wherein each of said color filters comprises a plurality of generally square-shaped pixels arranged in a manner selected from the group consisting of triangle, mosaic, and stripes.

15. A method for making color filter plates according to claim 1 wherein said glass substrate comprises an indium tin oxide layer formed on a glass plate.

16. A method for making color filter plates according to claim 1 which further comprises a prebake step prior to said flood exposure step by heating said positivie photoresist at temperatures that will not cause said positive photoresist to crosslink.

17. A method for making color filter plates each having a plurality of color filters comprising the steps of:

(a) forming a positive photoresist layer on an electrically conductive transparent glass substrate;

(b) exposing portions of said glass substrate to be electrodeposited with a designated color electrocoat by removing corresponding portions of said positive photoresist layer using a photomasked light exposure procedure followed by a development procedure with a developer solution, wherein said electrocoat is an anionic electrocoat;

(c) performing a flood exposure on remaining portions of said positive photoresist;

(d) electrodepositing said designated color electrocoat on said exposed portions of said glass substrate;

(e) performing a postbake procedure by heating said glass substrate to thereby harden said color electrocoat;

(f) using a developer solution to remove said remaining portions of said positive photoresist; and (g) repeating steps (a) through (f) until all the desired electrocoats are electrodeposited on said glass substrate;

(h) wherein said flood exposure step causes said photoresist to undergo a chemical reaction so that it will not crosslink during said postbake step and thus can be readily removed in step (f).

18. A method for making color filter plates each having a plurality of color filters comprising the steps of:

(a) forming a positive photoresist layer on an electrically conductive transparent glass substrate;

(b) exposing portions of said glass substrate to be electrodeposited with a designated color electrocoat by removing corresponding portions of said positive photoresist layer using a photomasked light exposure procedure followed by a development procedure with a developer solution, wherein said electrocoat is an anionic electrocoat;

(c) performing a flood exposure on remaining portions of said positive photoresist;

(d) electrodepositing said designated color electrocoat on said exposed portions of said glass substrate;

(e) performing a postbake procedure by heating said glass substrate to thereby harden said color electrocoat;

(f) using a developer solution to remove said remaining portions of said positive photoresist; and (g) repeating steps (a) through (f) until all the desired electrocoats, except the last electrocoat, are electrodeposited on said glass substrate;

(h) depositing said last electrocoat on naked portions of said glass substrate;

(i) wherein said flood exposure step causes said photoresist to undergo a chemical reaction so that it will not crosslink during said postbake step and thus can be readily removed in step (f).

19. A method for making color filter plates each having at least one color filter, said color filter comprising a plurality of spaced apart color pixels which are formed by electrodepositing an anionic electrocoat on a conductive glass substrate using a positive photoresist in cooperation with a masked exposure procedure, said method comprising the steps of:

(a) performing a flood exposure on said photoresist after said anionic electrocoat is electrodeposited on said conductive glass substrate;

(b) heating said conductive glass substrate in a postbake step to thereby harden said electrocoat; and (c) removing said photoresist;

(d) wherein said flood exposure step causes said photoresist to undergo a chemical reaction so that it will not crosslink during said postbake step and is thereby completely removed by a developer solution in said photoresist removal step.

20. A method for making color filter plates according to claim 19 which further comprises a prebake step prior to said flood exposure step in which said positive photoresist is heated at temperatures that will not cause said positive photoresist to crosslink.

* * * * *